United States Patent [19]
Takahashi et al.

[11] Patent Number: 4,825,808
[45] Date of Patent: May 2, 1989

[54] SUBSTRATE PROCESSING APPARATUS

[75] Inventors: Nobuyuki Takahashi; Hiroaki Kitahara, both of Fuchu, Japan

[73] Assignee: Anelva Corporation, Tokyo, Japan

[21] Appl. No.: 70,986

[22] Filed: Jul. 8, 1987

[30] Foreign Application Priority Data

Dec. 19, 1986 [JP] Japan .................. 61-303137

[51] Int. Cl.⁴ .................. C23C 14/00; C23C 16/00
[52] U.S. Cl. .................. 118/719; 118/715; 118/723; 118/725; 156/345; 204/298; 414/217
[58] Field of Search ............... 118/715, 719, 723, 725; 156/345; 204/298; 414/217

[56] References Cited
U.S. PATENT DOCUMENTS
4,592,306 6/1986 Gallego .................. 118/723

Primary Examiner—Richard Bueker
Attorney, Agent, or Firm—Pollock, VandeSande & Priddy

[57] ABSTRACT

A substrate processing apparatus includes input and output chambers for loading and unloading substrates into and out of the apparatus, a separation chamber connected to the input and output chambers, a plurality of substrate processing chambers connected to the separation chamber for processing the substrates therein, and gate valves provided between the separation chamber and the input and output chambers and between the separation chamber and the respective substrate processing chambers for selectively providing communication between the chambers between which the gate valves are arranged. The separation chamber is able to transfer the substrates therethrough, to distribute the substrate into the respective processing chambers and to temporarily maintain the substrate in the separation chamber. With this arrangement, the substrate processing apparatus is capable of effecting different processings of substrates by freely selecting the kinds, orders and repetitions of the processing for the substrates without any interference between these processings.

6 Claims, 2 Drawing Sheets

FIG_1
PRIOR ART
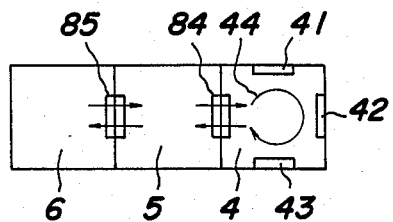
FIG_2
PRIOR ART
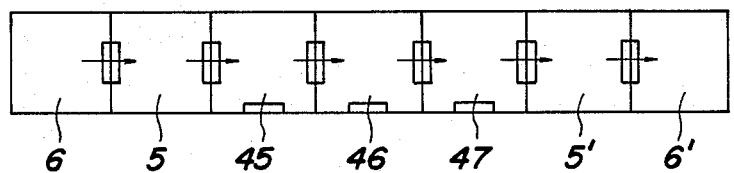

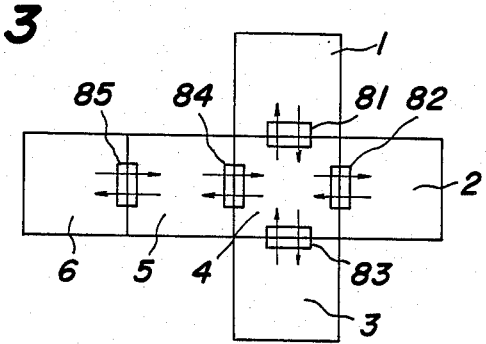
FIG_3
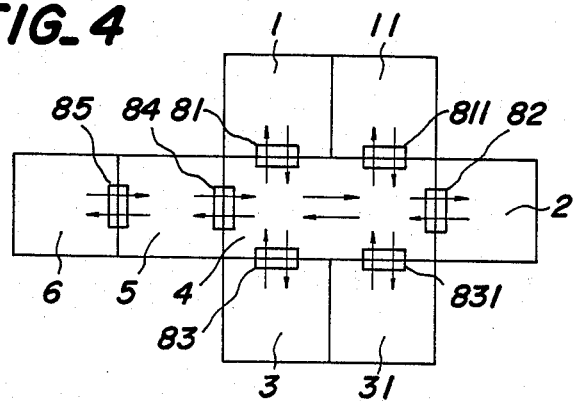
FIG_4
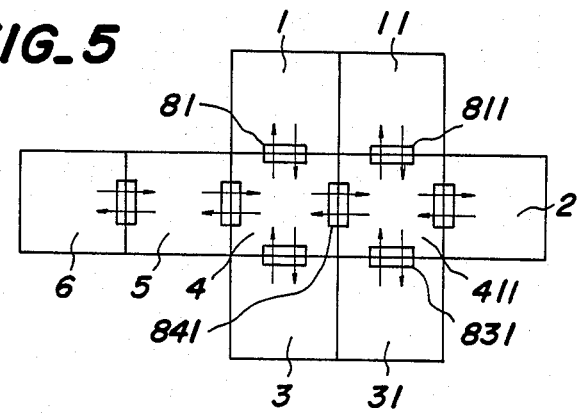
FIG_5

SUBSTRATE PROCESSING APPARATUS

BACKGROUND OF THE INVENTION

This invention relates to a substrate processing apparatus belonging to a semiconductor producing apparatus for processing a substrate successively and continuously with various different processings.

A substrate processing apparatus of this kind hitherto used does not include a separation chamber or "idle chamber" which is an essential feature of the present invention as later described.

Referring to FIG. 1, the apparatus of the prior art includes a load lock chamber 6 and a buffer chamber 5 for loading and unloading a substrate between the atmosphere and the processing apparatus, and a substrate processing chamber 4, these chambers being directly connected. (The load lock and buffer chambers 6 and 5 are referred to hereinafter as "input and output chambers".) For example, for the purpose of depositing three film layers on a substrate, cathodes 41, 42 and 43 are arranged in the substrate processing chamber 4. The substrate is transferred as shown by an arrow 44 so as to face the respective cathodes successively so that each separate sputtering process is applied to a surface of the substrate in a position facing each cathode.

In another case of the prior art, as shown in FIG. 2 an apparatus includes a load lock chamber 6 and a buffer chamber 5 next thereto for loading a substrate thereinto from the atmosphere, sputtering chambers 45, 46 and 47 for successively depositing three film layers of different materials on a surface of the substrate and a buffer chamber 5' and a load lock chamber 6' for unloading the substrate out of the apparatus into the atmosphere, these chambers being connected in series for the surface processing of the substrate.

With the apparatuses of the prior art above described, when different processings are continuously effected, these different processings sometimes interfere with each other and there are limitations of selection in kinds, orders, repetitions and the ilke of processings. Moreover, it is quite impossible to form continuous films of different material by different means, for example, the sputtering and chemical vapor depositing. In order to carry out such processing, an apparatus for this purpose becomes unavoidably bulky or is obliged to have more substrate processing chambers.

For example, if it is intended to effect a continuous etching process of a substrate by pretreatment, etching and post-treatment of the substrate, it cannot be carried out by an apparatus as shown in FIG. 1. Instead, an apparatus as shown in FIG. 2 is required. The reason why the apparatus shown in FIG. 1 cannot be employed is that the processings at the cathodes 41, 42 and 43 interfere with each other to lower the quality of the processings; and in order to obtain high quality of the processings, the apparatus is obliged to be operated with lower efficiency.

On the other hand, the apparatus as shown in FIG. 2 involves the following problems. The apparatus operates only with lower efficiency, because the processings are effected in series or one by one. Moreover, every time the gate valves are opened and closed, for example, noxious gases in the etching chambers may enter the pretreatment and post-treatment chambers to spoil the quality of the processing of a substrate.

SUMMARY OF THE INVENTION

It is an object of the invention to provide a compact substrate processing apparatus capable of freely selecting and carrying out kinds, orders and repetitions of processings for substrates without causing any interference with the processings even if different processings are employed.

In order to achieve this object, in a substrate processing apparatus including input and output chambers for loading and unloading substrates into and out of the apparatus and at least one substrate processing chamber connected to said input and output chambers for applying a plurality of processings to the substrates, the apparatus according to the invention comprises at least one separation chamber connected to the input and output chambers, a plurality of substrate processing chambers connected to said separation chamber for processing the substrates therein, and gate valves respectively provided between said separation chamber and said input and output chambers and between said separation chamber and said respective substrate processing chambers for communicating and shutting between the chambers between which the gate valves are arranged, and said separation chamber being able to transfer the substrates therethrough, to distribute the substrates into the respective processing chambers and to temporarily maintain the substrate in the separation chamber.

The invention will be more fully understood by referring to the following detailed specification and claims taken in connection with the appended drawings.

BRIEF DESCRIPTION OF THE DRAWINGS

FIG. 1 is a schematic view illustrating a substrate processing apparatus of the prior art;

FIG. 2 is a schematic view showing another substrate processing apparatus of the prior art;

FIG. 3 is a schematic view illustrating one embodiment of a substrate processing apparatus according to the invention;

FIG. 4 is a schematic view illustrating another embodiment of the substrate processing apparatus according to the invention; and FIG. 5 is a schematic view illustrating a further embodiment of the substrate processing apparatus according to the invention.

DESCRIPTION OF PREFERRED EMBODIMENTS

FIG. 3 illustrates a preferred embodiment of a substrate processing apparatus according to the invention comprising substrate processing chambers 1, 2 and 3 for processing a substrate and a separation chamber 4 which is a peculiar chamber according to the present invention and serves as an intermediary for the substrate processing chambers 1, 2 and 3.

In order to load the substrate from the atmosphere into an atmosphere in the apparatus and unload the substrate from the apparatus into the outer atmosphere, there are provided a load lock chamber 6 and a buffer chamber 5 next thereto as input and output chambers for the substrate. The buffer chamber 5 serves only as a buffer between the load lock chamber 6 and the substrate processing chambers 1, 2 and 3.

All the chambers 1-6 above described are provided with independent ventilating systems (not shown), respectively. Reference numerals 81-85 denote gate valves for communicating and shutting between the respective chambers.

The substrate is transferred in the apparatus as shown by arrows to be subjected to the processings.

The separation chamber 4 which is an essential feature of the invention will be explained in detail.

The substrate transferred from the load lock chamber 6 is fed through the buffer chamber 5 and the gate valve 84 into the separation chamber 4. Thereafter, the substrate is fed from the separation chamber 4 into any one of the substrate processing chambers 1, 2 and 3 for a first desired processing. After the first processing, assuming processing chamber 1 is used, the substrate is returned into the separation chamber 4 and then fed into the substrate processing chamber 2 or 3, which is different from the first processing chamber for a second processing. After the second processing, the substrate is again returned into the separation chamber 4 and then fed into the substrate processing chamber which may be separate from the first and second processing chambers or may be the first processing chamber.

In this manner, the substrate is fed into the substrate processing chambers 1, 2, and 3 in succession in any order through the separation chamber 4 centrally located so that the substrate is subjected to the processings continuously.

In this embodiment, moreover, while a first processing is being applied to a substrate A in, for example, the processing chamber 1, a processing may be simultaneously applied to a separate substrate B which has been fed into, for example, the separate processing chamber 3 through the buffer chamber 5 and the separation chamber 4. If there is enough time, a further separate substrate C may be processed in the remaining processing chamber 2. Thereafter, the same processing may be repeatedly applied to the substrates A, B and C. These substrates A, B and C are not shown in the drawings.

When different processings are applied to a plurality of substrates under various conditions in various times as above described, transferring of the substrates in the separation chamber 4 is preferably controlled programmably by a computer.

The gate valves 81, 82 and 83 are opened and closed when the substrates are transferred between the separation chamber 4 and the respective processing chambers 1, 2 and 3. With the exception of the time when the substrates are transferred between the chambers, the gate valves 81, 82 and 83 are always closed so that the processing chambers are completely shut to each other and therefore no gas moves between the chambers.

Therefore, when the substrates are transferred from the separation chamber 4 to the respective processing chambers 1, 2 and 3 or to the buffer chamber 5 or vice versa, the gate valves 81, 82, 83 and 84 are controlled to permit only one gate valve to open at a time. In this case, a treating gas or product gas from one processing chamber whose gate valve is opened flows only into the separation chamber 4. However, as the separation chamber includes an independent ventilating system, the gas which flowed in the separation chamber is instantly exhausted from the chamber by closing the gate valve immediately after the transporting of the substrate. It is therefore possible to prevent a gas in the previous processing chamber from entering the next processing chamber to contaminate the substrate therein by controlling the gate valves in a manner to open the gate valve after a delay time since the previous gate valve is closed.

As a result, it becomes possible to use quite different gases in the substrate processing chambers 1, 2 and 3. Quite different degrees of vacuum and different processings and means can be freely employed in the respective substrate processing chambers. For example, it is also possible to use even a combination of inherently different film depositing processes selected from the sputtering, chemical vapor deposition, vapor deposition and ECR deposition. Moreover, before, after and between these processings, further different processings such as heating processing, sputtering etching processing and reactive ion etching processing may be freely used.

The substrate processing chambers can be completely separated in the manner above described. Therefore, if any trouble is caused in one substrate processing chamber, the gate valve associated with the chamber is closed to separate only that chamber from the other chambers; and therefore repairing and cleaning can be freely effected for the separated chamber. During such a repairing or cleaning, furthermore, the operation of the apparatus can be normally continued. This is a significant additional effect.

In the first embodiment, the three substrate processing chambers 1, 2 and 3 are arranged about the one separation chamber 4 in FIG. 3. In another embodiment of the invention, the substrate processing apparatus is constituted as shown in FIG. 4. In this embodiment, a separation chamber 4 is enlarged or elongated and additional substrate processing chambers 11 and 31 are arranged one on each side of the elongated portions of the separation chamber 4. When the separation chamber 4 is further elongated and more processing chambers are provided on both sides of the further elongated portion of the separation chamber, only one substrate processing apparatus according to the invention can provide for a requirement to simultaneously carry out a multiplicity of processings.

If required, an elongated separation chamber 4 is provided therein with a partition or partitions and a gate valve or valves 841 to separate the separation chamber into a plurality of chambers 4 and 411 as shown in FIG. 5. In this case, independent ventilating systems are provided in the respective separation chambers 4 and 411, so that the number of the gate valves simultaneously openable is increased and interference between the processing chambers connected to the respective separation chambers is reduced, thereby improving the independence in processing.

The enlargement of the separation chamber in this manner improves the performance of the substrate processing apparatus and increases the freedom in processing. If required, it will be possible to continuously carry out almost all of the processings for manufacturing semiconductor devices in the substrate processing apparatus according to the invention.

Moreover, by completely effecting the control of timing and order of the processings by a computer, processings for manufacturing semiconductor devices of different kinds can be simultaneously and continuously carried out only in one substrate processing apparatus according to the invention.

If there are pretreatments, post-treatments and intermediate treatments common to respective processings, such common treatments may be effected in the separation chamber of the apparatus according to the invention.

As can be seen from the above explanation, the present invention has the significant effect of providing a compact substrate processing apparatus capable of effecting different processings of substrates by freely selecting the kinds, orders, repetitions and the like of the processings for the substrates without interference between the processings.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A substrate processing apparatus including input and output chambers for loading and unloading substrates into and out of the apparatus and at least one substrate processing chamber connected to said input and output chambers for applying a plurality of processings to the substrates, said apparatus comprising:

at least one separation chamber connected to the input and output chambers;

a plurality of substrate processing chambers connected to said separation chamber for processing the substrates therein, said input and output chambers and said substrate processing chambers being arranged about said separation chamber; and gate valves respectively provided between said separation chamber and said input and output chambers and between said separation chamber and said respective substrate processing chambers for selective communication of the chambers between which the gate valves are arranged;

said separation chamber being able to transfer the substrates therethrough, to temporarily maintain the substrates therein, and to distribute the substrates into the respective processing chambers;

wherein the dimension of said separation chamber is enlargeable to accommodate a plurality of substrate processing chambers to be arranged thereabout; and wherein at least one partition is provided in said enlarged separation chamber to divide the same into a plurality of smaller separation chambers, the partition being provided with a gate valve for selectively providing passage between the smaller separation chambers.

2. A substrate processing apparatus as set forth in claim 1, wherein said gate valves provided between said separation chamber and said substrate processing chamber are so constructed that when any one of the gate valves is operated, all the other gate valves are kept closed, and after a predetermined delay time has expired since any one of the gate valves was closed, any other gate valve may be opened.

3. A substrate processing apparatus as set forth in claim 1, wherein said plurality of substrate processing chambers include a film forming chamber, a pretreatment chamber, a post-treatment chamber and an etching chamber.

4. A substrate processing apparatus as set forth in claim 3, wherein said film forming chamber comprises means selected from sputtering, chemical vapor depositing, vapor depositing and ECR depositing.

5. A substrate processing apparatus as set forth in claim 3, wherein said pretreatment chamber comprises means selected from heating, sputtering etching and reactive ion etching.

6. A substrate processing apparatus as set forth in claim 3, wherein said post-treatment chamber comprises heating means.

* * * * *